(12) United States Patent
Fung

(10) Patent No.: US 7,960,788 B2
(45) Date of Patent: Jun. 14, 2011

(54) REPLACING SYMMETRIC TRANSISTORS WITH ASYMMETRIC TRANSISTORS

(75) Inventor: Ka-Hing Fung, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 653 days.

(21) Appl. No.: 11/657,826

(22) Filed: Jan. 25, 2007

(65) Prior Publication Data
US 2008/0179673 A1 Jul. 31, 2008

(51) Int. Cl.
| H01L 29/76 | (2006.01) |
| H01L 29/94 | (2006.01) |
| H01L 31/062 | (2006.01) |
| H01L 31/113 | (2006.01) |
| H01L 31/119 | (2006.01) |

(52) U.S. Cl. ................ 257/344; 257/408; 257/E21.62; 257/E29.279

(58) Field of Classification Search ............. 257/E21.62, 257/344, 408, E29.279; 438/286, 302
See application file for complete search history.

(56) References Cited

U.S. PATENT DOCUMENTS

| 5,828,104 A | 10/1998 | Mizushima | |
| 5,830,788 A | 11/1998 | Hiroki et al. | |
| 5,891,774 A * | 4/1999 | Ueda et al. | ............ 438/264 |
| 6,746,924 B1 * | 6/2004 | Lee et al. | ............ 438/286 |
| 7,449,386 B2 * | 11/2008 | Lin et al. | ............ 438/302 |
| 2001/0042891 A1 * | 11/2001 | Park et al. | ............ 257/377 |
| 2004/0241950 A1 * | 12/2004 | Olofsson | ............ 438/301 |
| 2005/0263819 A1 | 12/2005 | Suh | |
| 2006/0017113 A1 * | 1/2006 | Xu et al. | ............ 257/369 |

FOREIGN PATENT DOCUMENTS

| CN | 1602544 A | 3/2005 |
| CN | 1702875 A | 11/2005 |

OTHER PUBLICATIONS

Buti et a. "A New Asymmetrical Halo Source GOLD Drain (HS-GOLD) Deep Sub-Half-Mircrometer n-MODFET Design for Reliability and Performance", IEEE Transactions on electron devices. vol. 38, No. 9. Aug. 1991, pp. 1757-1764.*

Ghani, T., et al., "Asymmetric Source/Drain Extension Transistor Structure for High Performance Sub-50nm Gate Length CMOS Devices," 2001 Symposium on VLSI Technology Digest of Technical Papers, (2001), 2 pages, IEEE.

* cited by examiner

*Primary Examiner* — David S Blum
(74) *Attorney, Agent, or Firm* — Slater & Matsil, L.L.P.

(57) ABSTRACT

A semiconductor structure includes a symmetric metal-oxide-semiconductor (MOS) transistor comprising a first and a second asymmetric MOS transistor. The first asymmetric MOS transistor includes a first gate electrode, and a first source and a first drain adjacent the first gate electrode. The second asymmetric MOS transistor includes a second gate electrode, and a second source and a second drain adjacent the second gate electrode. The first gate electrode is connected to the second gate electrode, wherein only one of the first source and the first drain is connected to only one of the respective second source and the second drain.

8 Claims, 9 Drawing Sheets

US 7,960,788 B2

REPLACING SYMMETRIC TRANSISTORS WITH ASYMMETRIC TRANSISTORS

TECHNICAL FIELD

This invention relates generally to integrated circuits, and more particularly to the structure and formation methods of metal-oxide-semiconductor transistors.

BACKGROUND

With the increasing down-scaling of integrated circuits, the sizes of metal-oxide-semiconductor (MOS) field-effect transistors (FET) have been increasingly reduced. As a result, existing semiconductor devices are formed with a minimum size in a half-micron region or in a sub-half micron region. At this stage of development, efforts are being made to bring the sizes of MOSFETs down to a quarter micron or a sub-quarter micron.

With such small sizes, the electric characteristics of the MOSFETs are likely to be degraded because of short-channel effects or hot-carrier effects, thereby seriously influencing the reliability of the MOSFETs. On the other hand, high-speed operations and low power consumption are also desired. In order to reduce the degradation caused by hot-carrier effects and/or short-channel effects, and at the same time improve the drivability, MOSFETs having asymmetric impurity concentration profiles have been proposed.

FIG. 1 illustrates a conventional asymmetric MOSFET, which includes gate dielectric 4 on semiconductor substrate 2, and gate electrode 6 on gate dielectric 4. The MOSFET further includes source/drain regions 10 and source extension region 8. On the drain side, no source/drain extension region is formed. Typically, in order to form the asymmetric structure, a photoresist is formed to mask the drain side of the MOSFET, then the source extension region 8 is formed by an implantation.

Asymmetric MOSFETs have high drive currents, and can be scaled down more than symmetric MOSFETs. Therefore, it is preferred to use asymmetric MOSFETs to replace symmetric MOSFETs in integrated circuits. In typical integrated circuits, most of the symmetric MOSFETs can be replaced by asymmetric MOSFETs. Only a small percent of symmetric MOSFETs cannot be replaced. Accordingly, the integrated circuits have to have mixed symmetric and asymmetric MOSFETs. Such a mixed scheme not only results in extra masks and implantation steps, but also creates difficulty and increased cost in the modeling.

Accordingly, what is needed in the art is a MOSFET structure and methods for forming the same that may incorporate asymmetric MOSFETs to take advantage of the benefits associated with improved performance while at the same time overcoming the deficiencies of the prior art.

SUMMARY OF THE INVENTION

In accordance with one aspect of the present invention, a semiconductor structure includes a symmetric metal-oxide-semiconductor (MOS) transistor comprising a first and a second asymmetric MOS transistor. The first asymmetric MOS transistor includes a first gate electrode, and a first source and a first drain adjacent the first gate electrode. The second asymmetric MOS transistor includes a second gate electrode, and a second source and a second drain adjacent the second gate electrode. The first gate electrode is connected to the second gate electrode, wherein only one of the first source and the first drain is connected to only one of the respective second source and the second drain.

In accordance with another aspect of the present invention, a semiconductor structure includes a semiconductor substrate and a first and a second asymmetric MOS transistor. The first asymmetric MOS transistor includes a first gate dielectric on the semiconductor substrate; a first gate electrode on the first gate dielectric; a first source extension region in the semiconductor substrate, wherein the first source extension region extends under the first gate electrode; and a first source region adjoining the first source extension region, wherein the first source region is spaced apart further from the first gate dielectric than the first source extension region. The second asymmetric MOS transistor includes a second gate dielectric on the semiconductor substrate; a second gate electrode on the second gate dielectric; a second source extension region in the semiconductor substrate, wherein the second source extension region extends under the second gate electrode; and a second source region adjoining the second source extension region, wherein the second source region is spaced apart further from the second gate dielectric than the second source extension region. The semiconductor structure further includes a common drain region between and adjacent to the first and the second gate dielectrics, wherein the first and the second MOS transistors are substantially free from drain extension regions.

In accordance with yet another aspect of the present invention, a semiconductor chip includes a plurality of MOS transistors, wherein all MOS transistors in the semiconductor chip are asymmetric. The plurality of MOS transistors includes at least one pair of MOS transistors comprising a first asymmetric MOS transistor comprising a first gate electrode, and a first source and a first drain adjacent the first gate electrode; a second asymmetric MOS transistor comprising a second gate electrode, and a second source and a second drain adjacent the second gate electrode. The first gate electrode is connected to the second gate electrode. Only one of the first source and first drain is connected to only one of the respective second source and the second drain.

In accordance with yet another aspect of the present invention, a method for forming a semiconductor structure includes forming a first asymmetric MOS transistor comprising a first gate electrode, and a first source and first drain adjacent the first gate electrode; forming a second asymmetric MOS transistor comprising a second gate electrode, and a second source and second drain adjacent the second gate electrode; connecting the first gate electrode to the second gate electrode; and connecting only one of the first source and the first drain to only one the respective second source and the second drain.

In accordance with yet another aspect of the present invention, a method for forming a semiconductor structure includes providing a semiconductor substrate; forming a first gate dielectric on the semiconductor substrate; forming a second gate dielectric on the semiconductor substrate, wherein the first and the second gate dielectrics are adjacent to each other with a substrate region therebetween; forming a first gate electrode on the first gate dielectric; forming a second gate electrode on the second gate dielectric; performing a first tilt implantation to form a first source extension region of a first asymmetric MOS transistor, wherein the first gate electrode substantially shadows the substrate region from being implanted; and performing a second tilt implantation to form a second source extension region of a second asymmetric MOS transistor, wherein the second gate electrode substantially shadows the substrate region from being implanted; forming a first source region adjoining the first source extension region; forming a second source region adjoining the second source extension region; implanting a portion of the substrate region to form a common drain; and electrically connecting the first and the second gate electrodes.

The advantageous features of the present invention include reduced complexity and cost for manufacturing and modeling, and improved performance.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A novel method for forming a symmetric metal-oxide-semiconductor (MOS) field-effect transistor (FET) is provided. The intermediate stages of manufacturing a preferred embodiment of the present invention are illustrated. The variations and operation of the preferred embodiments are then discussed. Throughout the various views and illustrative embodiments of the present invention, like reference numbers are used to designate like elements.

Figure 1:
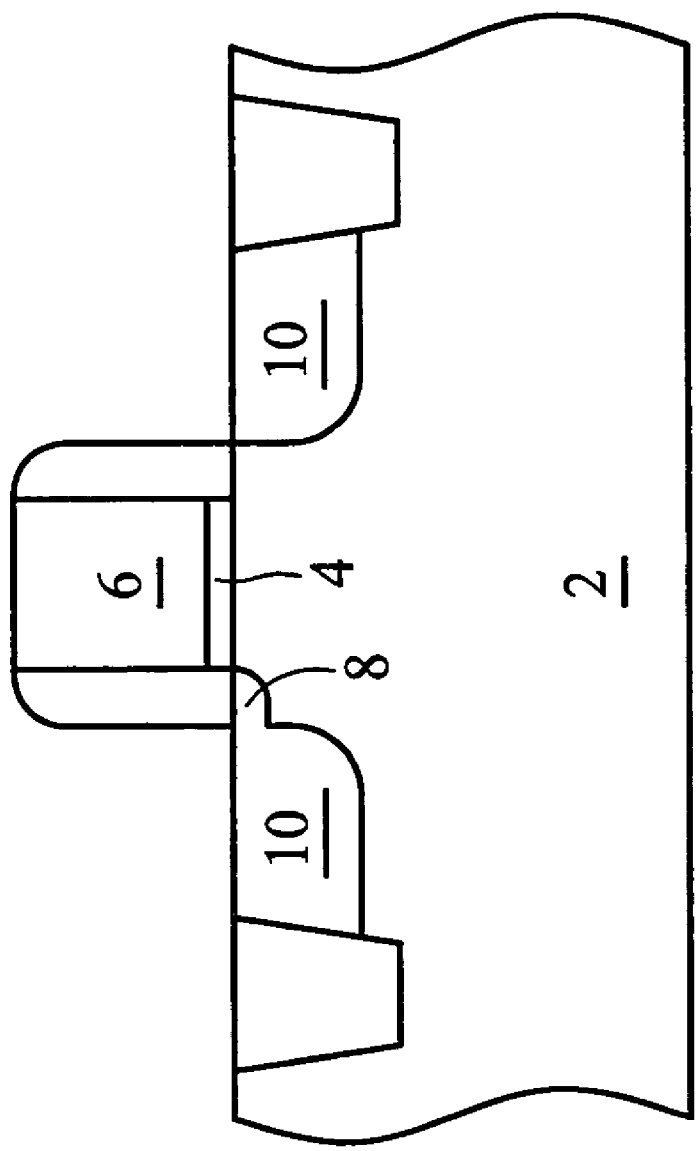
FIG. 1 illustrates a conventional asymmetric metal-oxide-semiconductor field effect transistor (MOSFET)
Figure 2:
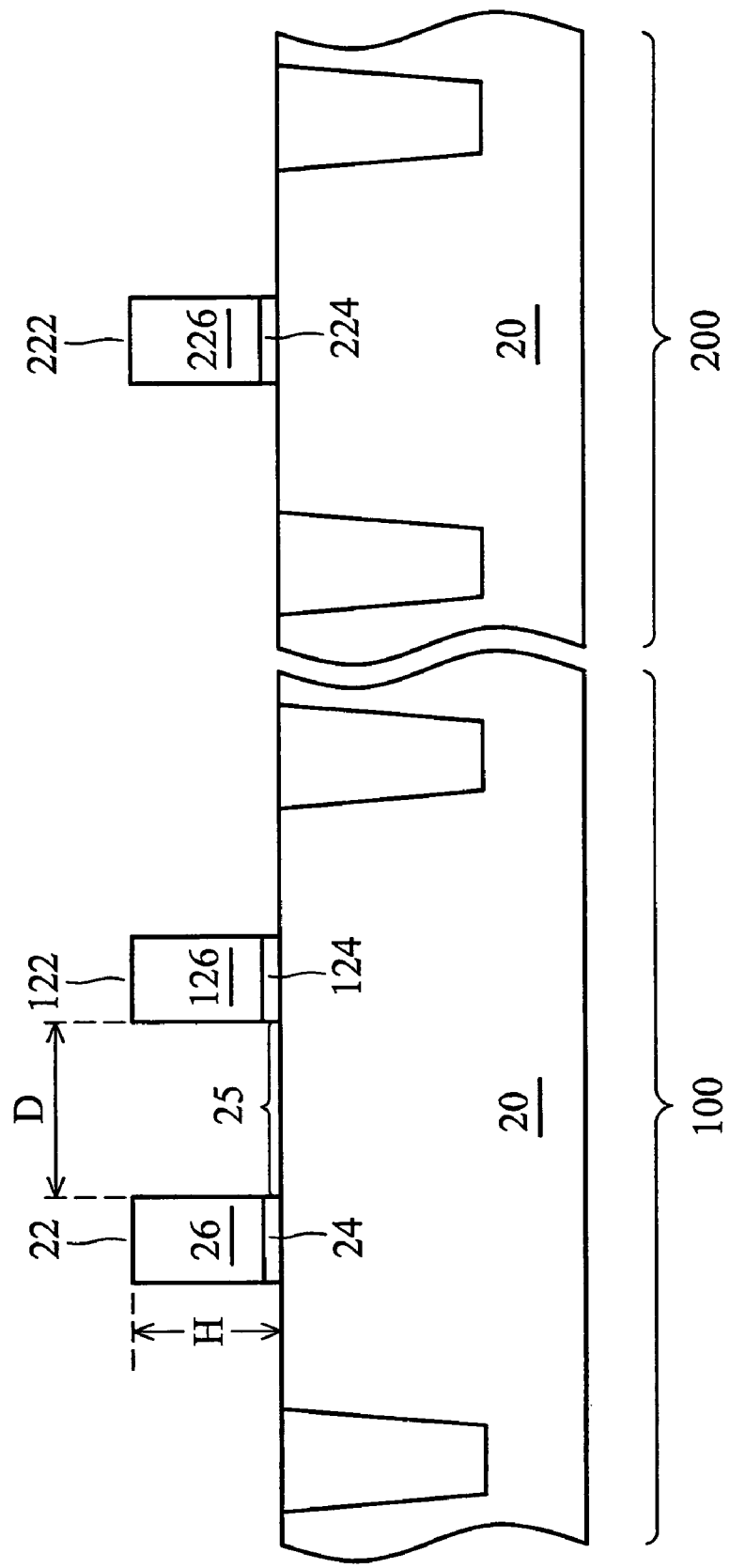
FIGS. 2 through 6 are cross-sectional views of intermediate stages in the manufacturing of a first embodiment of the present invention, wherein a symmetric MOSFET is formed using asymmetric MOSFETs.

FIGS. 2 through 6 illustrate cross-sectional views of intermediate stages in the manufacturing of a first embodiment of the present invention. Referring to FIG. 2, gate stacks 22, 122 and 222 are formed on semiconductor substrate 20. In one embodiment, semiconductor substrate 20 is formed of a bulk material such as silicon. In alternative embodiments, semiconductor substrate 20 has a silicon-on-insulator (SOI) structure, which includes a silicon layer on a buried oxide (BOX) layer (not shown). Other group III, group IV and group V elements may also be included. Semiconductor substrate 20 includes region 100 for forming a symmetric MOSFET, which is formed of asymmetric MOSFETs, and region 200 for forming an asymmetric MOSFET.

Gate stacks 22, 122 and 222 include gate dielectric 24 and gate electrode 26, gate dielectric 124 and gate electrode 126, and gate dielectric 224 and gate electrode 226, respectively. Gate dielectrics 24, 124 and 224 may include commonly used dielectric materials, such as silicon oxide, silicon nitride, silicon oxynitride, high-k materials such as HfAlO, $HfO_2$, $Ta_2O_5$, $ZrO_2$, and the like, and combinations thereof. Gate electrodes 26, 126 and 226 may include polysilicon, metals, metal silicides, metal nitrides, and combinations thereof. As is known in the art, gate stacks 22, 122 and 222 may be formed by forming a gate electrode layer on a gate dielectric layer, and then patterning the stacked layers. The preferred methods for depositing the gate dielectric layer and the gate electrode layer include commonly used deposition techniques, such as plasma enhanced chemical vapor deposition (PECVD), low-pressure chemical vapor deposition (LPCVD), sub-atmospheric chemical vapor deposition (SACVD), and the like. In an exemplary embodiment, height H of gate stacks 22, 122 and 222 are between about 600 Å and about 1000 Å.

Preferably, gate stacks 22 and 122 are close to each other. The distance D between gate stacks 22 and 122 is preferably small enough so that the impurities introduced by the subsequent tilt implanting of source/drain extension (SDE) regions are not implanted into semiconductor substrate region 25, which is between gate stacks 22 and 122. On the other hand, distance D is also preferably great enough so that after gate spacers are formed on sidewalls of gate stacks 22 and 122, there is still a space between the gate spacer on gate stack 22 and the spacer on gate stack 122. The details are provided in subsequent paragraphs. In an exemplary embodiment, distance D is preferably less than about 2000 Å, and more preferably between about 1400 Å and about 2000 Å. One skilled in the art will realize, however, that preferred distance D and other dimensions recited throughout the description are merely examples, and will change accordingly with the scaling of the formation technology.

Figure 3:
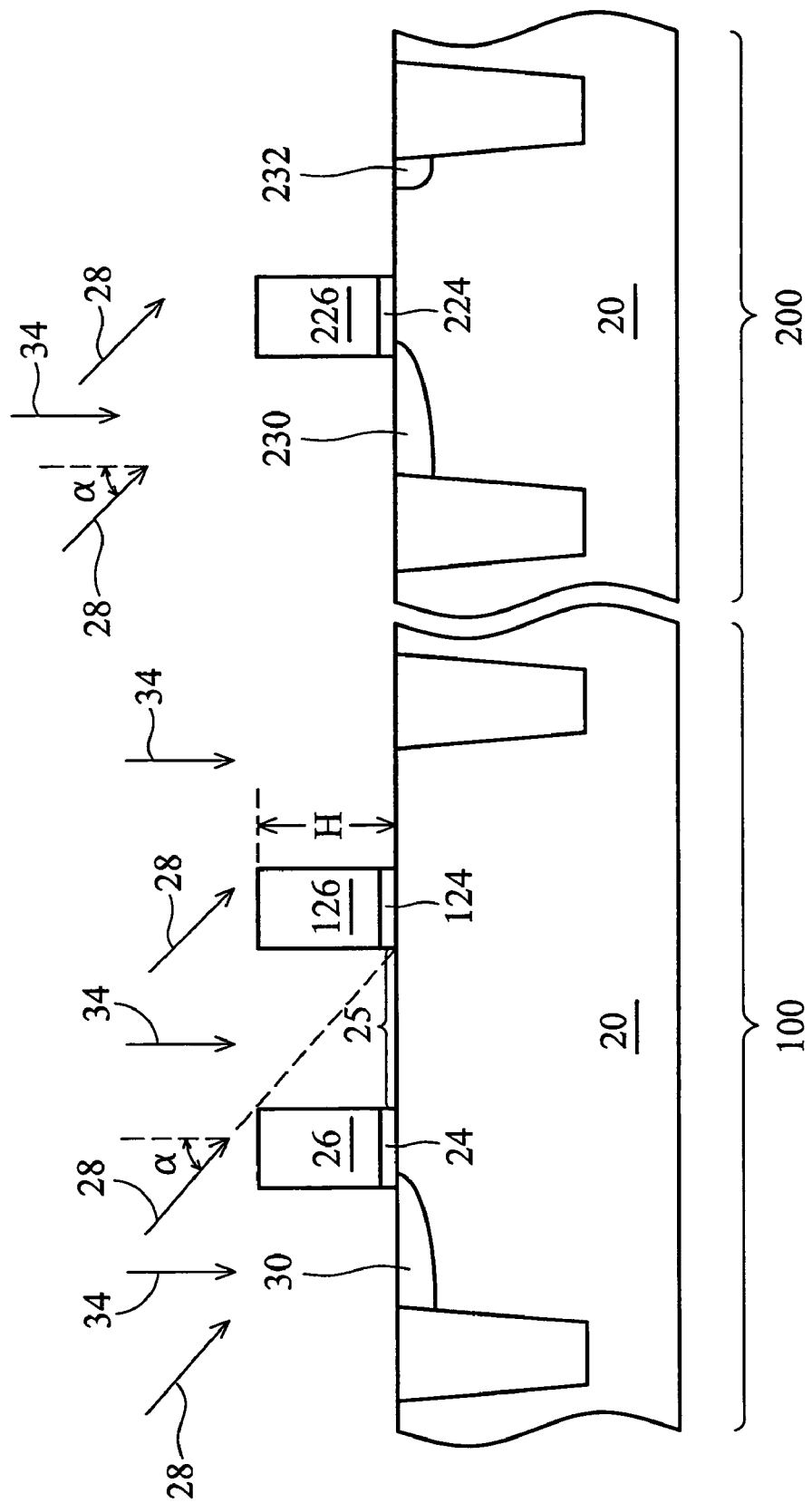

A first tilt implantation is then preformed to form source extension regions 30 and 230, as illustrated in FIG. 3. The tilt implantation is hence referred to as a source/drain extension (SDE) implantation. The tilt SDE implantation is symbolized by arrows 28. Depending on the desired type of the resulting MOSFETs, either an n-type impurity, such as arsenic and/or phosphorus, or a p-type impurity, such as boron, is implanted. The sides on which SDE regions 30 and 230 are located are the source sides of the resulting MOSFETs. In an embodiment, no mask is formed in region 200, and the resulting drain extension region 232, if any, is horizontally spaced apart from gate stack 222 due to the masking of gate electrode 226. In other embodiments, a mask (not shown) may be formed to mask the drain side of the MOSFET in region 200.

The preferred tilt angle α may be roughly calculated based on the height H of gate stacks 22 and 122 and distance D between gate stacks 22 and 122. Preferably, tilt angle α is great enough so that substrate region 25 is shadowed from the implantation by gate stack 22. In an exemplary embodiment, tilt angle α is greater than about 10 degrees, and more preferably between about 10 and about 30 degrees. It is appreciated that the preferred tilt angle α is related to the ratio of distance D to height H. Accordingly, a ratio of distance D to height H is preferably less than about 2, and more preferably less than about 0.5.

Pocket regions (not shown) are also formed by tilt implanting an impurity having a different conductivity type from the impurity introduced in the tilt SDE implantation. Preferably, the tilt angle for forming the pocket regions is also great enough so that there is substantially no impurity implanted into substrate region 25.

In an embodiment, a vertical SDE implantation, which is symbolized by arrows 34, is optionally performed in addition to the tilt SDE implantation. Preferably, the vertical SDE implantation uses a dosage substantially lower than the dosage of the tilt SDE implantation. In an exemplary embodiment, the dosage of vertical SDE implantation 34 is less than about 10 percent of the dosage of tilt SDE implantation 28. In another exemplary embodiment, vertical SDE implantation 34 is skipped. The optimum ratio between the dosage of vertical SDE implantation 34 and the dosage of tilt SDE implantation 28 may be found through experiments.

Figure 4:
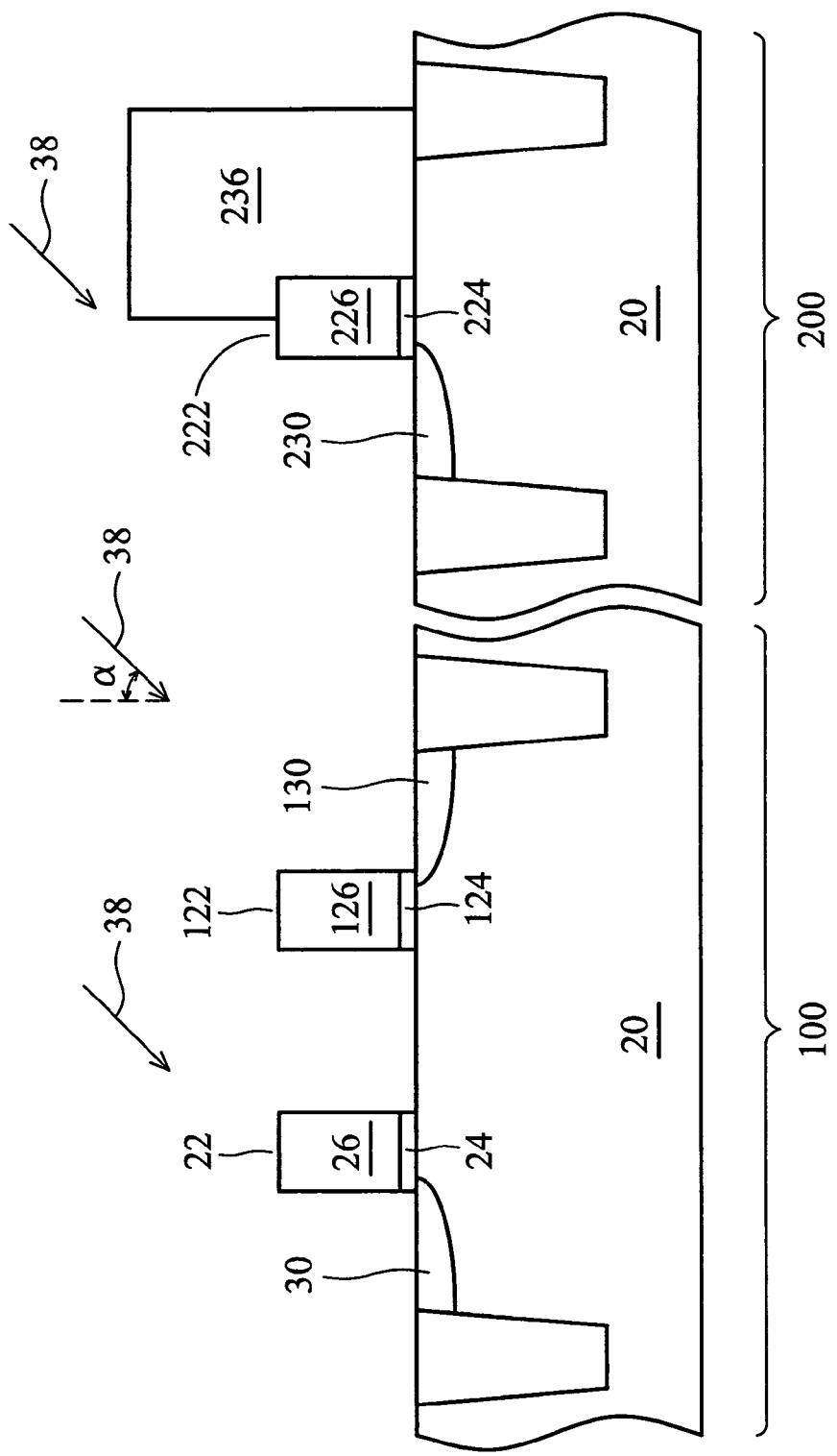

FIG. 4 illustrates the formation of source extension region 130. In an embodiment, photoresist 236 is formed to mask entire region 200. In alternative embodiments, photoresist 236 covers only the drain side of the MOSFET in region 200. Tilt SDE implantation 38 is then performed. Preferably, tilt SDE implantation 38 is performed at a substantially same tilt angle α and using a substantially same dosage as tilt SDE implantation 28 (refer to FIG. 3). In other embodiments, the tilt angles and dosages of tilt SDE implantations 28 and 38 may be different. Tilt SDE implantation 38 results in source extension region 130. Similar to FIG. 3, gate stack 122 shadows substrate region 25 from tilt SDE implantation 38, so that substantially no drain extension region is formed in substrate region 25.

Figure 5:
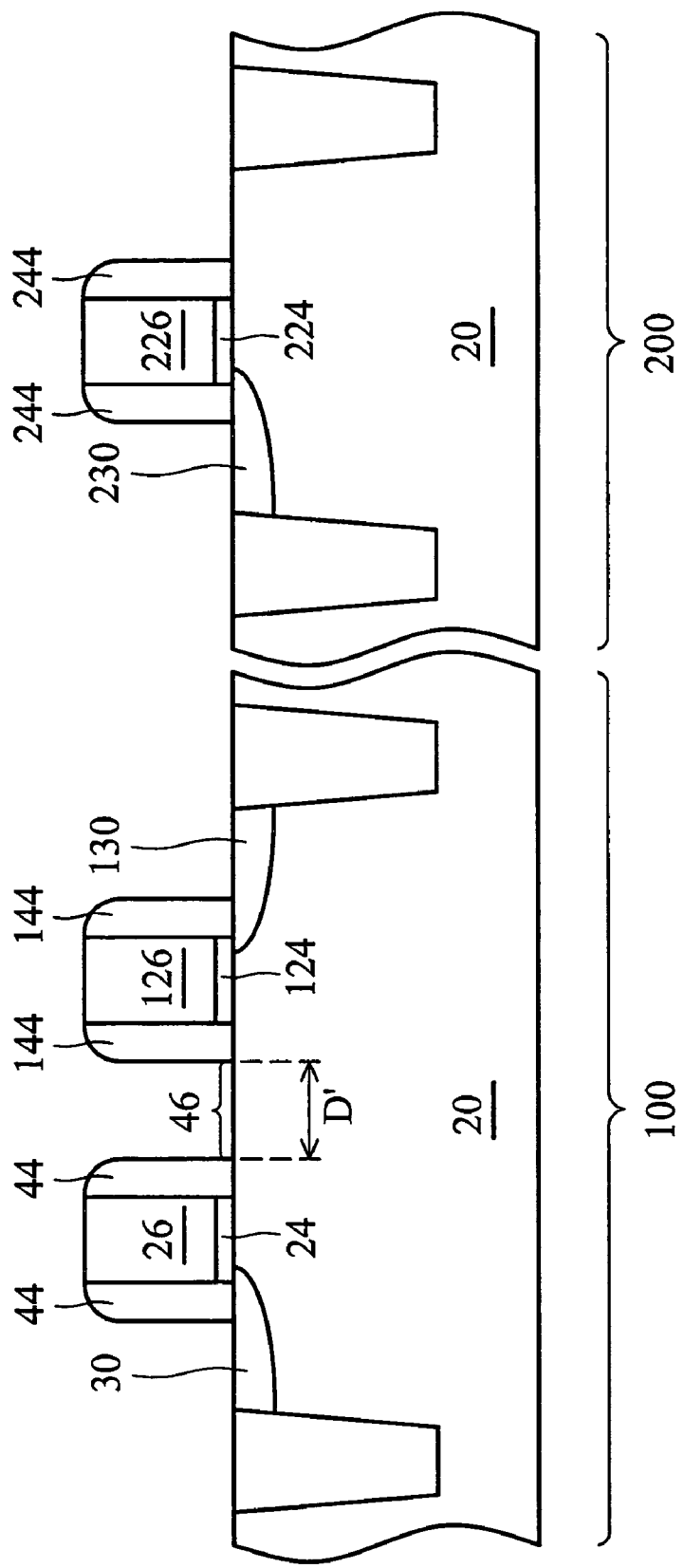

FIG. 5 illustrates the formation of gate spacers 44, 144 and 244. As is known in the art, to form gate spacers, a gate spacer layer (not shown) is formed. The gate spacer layer may include a single layer or more than two layers, each comprising oxide, silicon nitride, silicon oxynitride and/or other dielectric materials. The gate spacer layer is then etched with its horizontal portions removed, leaving gate spacers 44, 144 and 244. The neighboring gate spacers 44 and 144 are spaced apart, so that substrate region 46 is exposed. In an exemplary embodiment, substrate region 46 has a width D' of less than about 1000 Å, and more preferably between about 400 Å and about 800 Å, although greater or smaller width may be adopted.

Figure 6:
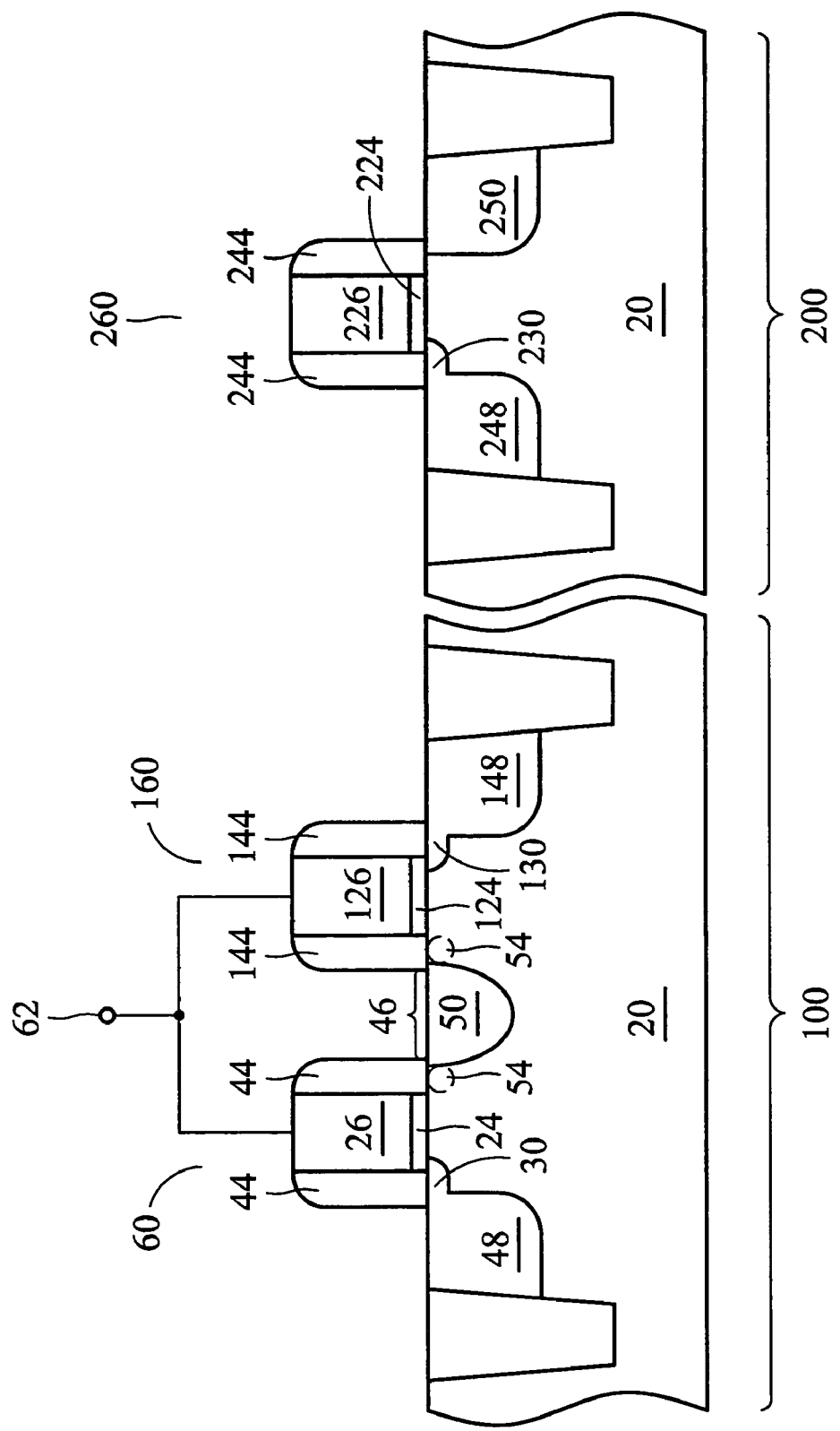

FIG. 6 illustrates the formation of source/drain regions 48, 50, 148, 248 and 250. As is known in the art, source/drain regions 48, 50, 148, 248 and 250 may be formed by implanting a desired n-type or p-type impurity, which type is the same as source extension regions 30, 130 and 230. The implantation is preferably vertical. In the resulting structures, regions 48, 148 and 248 are source regions of the resulting asymmetric MOSFET 60, 160 and 260, respectively. Region 250 is the drain region of MOSFET 260. Region 50 is the common drain region of MOSFETs 60 and 160. As a result of the vertical SDE implantation 34 and the diffusion from common drain region 50, substrate regions 54 have a low impurity concentration, which is substantially lower than the impurity concentration in source extension regions 30 and 230. Since common drain region 50 and source/drain regions 48 and 148 may be formed using a same implantation process, common drain region 50 may extend to a substantially same depth into semiconductor substrate 20 as source/drain regions 48 and 148.

Figure 7:
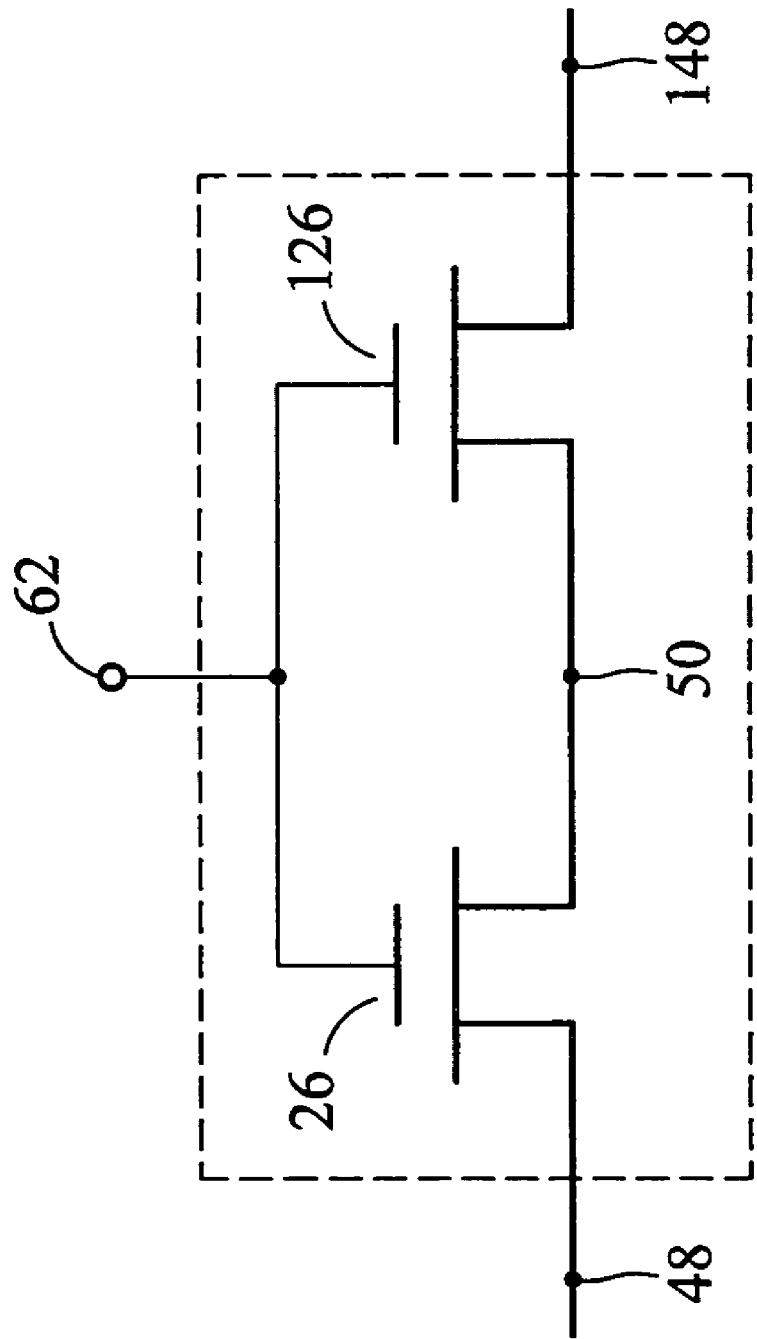
FIG. 7 illustrates a symbol of the symmetric MOSFET formed of asymmetric MOSFETs.

In subsequent steps, silicide regions, contact etch stop layers (CESL) and contact plugs are formed. Gate electrode 26 and 126 are then interconnected, preferably through a metal line formed in metallization layers (not shown). The formation of the silicide regions, CESL, and metallization layers are well known in the art, and thus are not repeated herein. The connection between gate electrodes 26 and 126 results in common gate 62. As a result, asymmetric MOSFETs 60 and 160, with their gates 26 and 126 interconnected, in combination act as a symmetric MOSFET. When connected into integrated circuits, the interconnected gate electrodes 26 and 126 act as a gate of a symmetric MOSFET, and source regions 48 and 148 act as a source and a drain of the symmetric MOSFET. FIG. 7 illustrates a symbol of the resulting symmetric MOSFET. MOSFET 260 remains as an asymmetric MOSFET.

Figure 8:
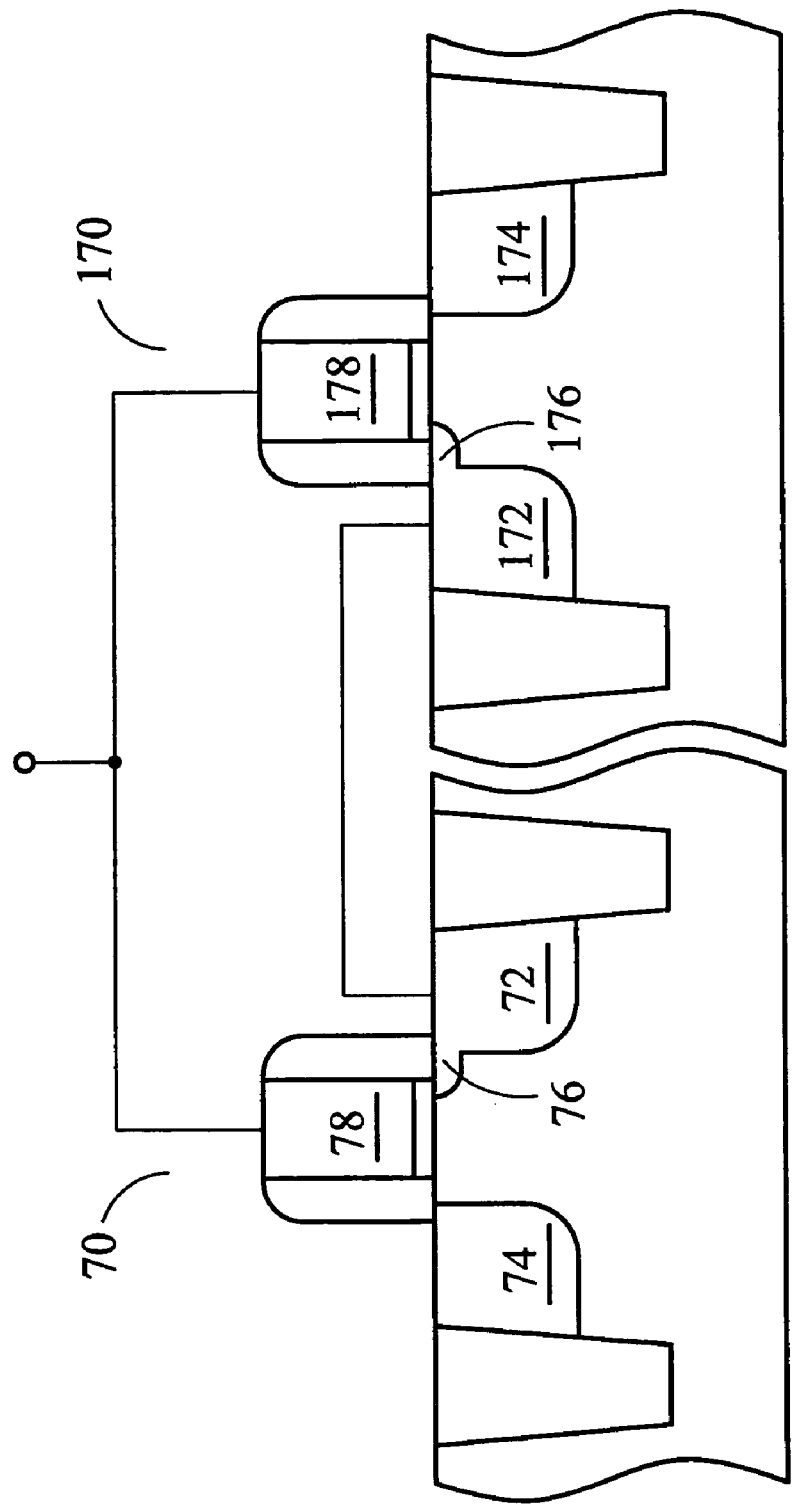
FIG. 8 illustrates a second embodiment of the present invention, wherein source regions of two asymmetric MOSFETs are connected.

FIG. 8 illustrates a second embodiment of the present invention, which includes asymmetric MOSFETs 70 and 170. MOSFET 70 includes source extension region 76, source region 72 and drain region 74. MOSFET 170 includes source extension region 176, source region 172 and drain region 174. Each of the asymmetric MOSFETs 70 and 170 may be formed using essentially the same method as forming MOSFET 260 (refer to FIG. 6). Source regions 72 and 172 are interconnected, and are preferably floating. Gate electrodes 78 and 178 are interconnected. Accordingly, MOSFETs 70 and 170 in combination act as a symmetric MOSFET, and drain regions 74 and 174 act as source and drain regions of the symmetric MOSFET.

Figure 9:
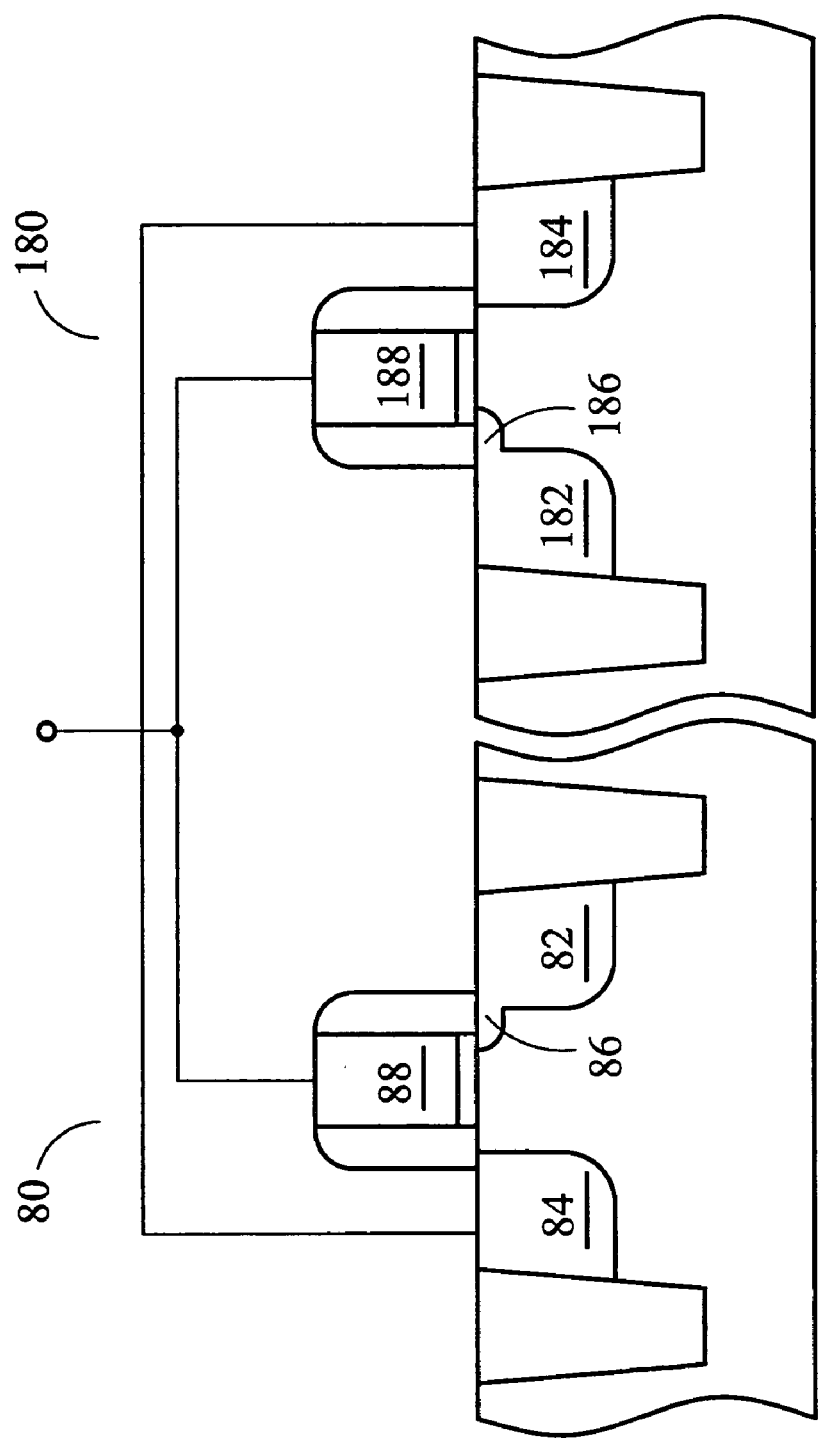
FIG. 9 illustrates a third embodiment of the present invention, wherein drain regions of two asymmetric MOSFETs are connected.

FIG. 9 illustrates a third embodiment of the present invention, which includes asymmetric MOSFETs 80 and 180. MOSFET 80 includes source extension region 86, source region 82 and drain region 84. MOSFET 180 includes source extension region 186, source region 182 and drain region 184. Similarly, each of the MOSFETs 80 and 180 may be formed using essentially the same method as forming MOSFET 260 (refer to FIG. 6). Source regions 82 and 182 are interconnected, and are preferably floating. Gate electrodes 88 and 188 are interconnected. Accordingly, asymmetric MOSFETs 80 and 180 in combination act as a symmetric MOSFET, and source regions 82 and 182 act as source and drain regions of the symmetric MOSFET.

The embodiments of the present invention have several advantageous features. By forming symmetric MOSFETs using asymmetric MOSFETs, only asymmetric MOSFETs need to be formed regardless whether the integrated circuits have symmetric MOSFETs or not. The cost of manufacturing the integrated circuits is reduced. The overall performance of the integrated circuits may be improved. Further, only asymmetric MOSFETs need to be simulated in the modeling. This significantly reduces the complexity and cost for the modeling.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:
1. A semiconductor structure comprising:
   a semiconductor substrate;
   a first asymmetric MOS transistor comprising:
      a first gate dielectric on the semiconductor substrate;
      a first gate electrode on the first gate dielectric;
      a first source extension region in the semiconductor substrate, wherein the first source extension region extends under the first gate electrode; and
      a first source region adjoining the first source extension region, wherein the first source region is spaced apart further from the first gate dielectric than the first source extension region is spaced from the first gate dielectric;

a second asymmetric MOS transistor comprising:
 a second gate dielectric on the semiconductor substrate;
 a second gate electrode on the second gate dielectric, wherein a distance between the first and the second gate electrodes is less than about two times a height of the first and the second gate electrodes;
 a second source extension region in the semiconductor substrate, wherein the second source extension region extends under the second gate electrode;
 a second source region adjoining the second source extension region, wherein the second source region is spaced apart further from the second gate dielectric than the second source extension region is spaced from the second gate dielectric; and
a common drain region between and adjacent to the first and the second gate dielectrics, wherein the first and the second asymmetric MOS transistors are substantially free from drain extension regions, and wherein the common drain region extends to substantially a same depth into the semiconductor substrate as the first and the second source regions.

2. The semiconductor structure of claim 1, wherein the distance between the first and the second gate electrodes is less than about 2000 Å.

3. The semiconductor structure of claim 1 further comprising a first gate spacer on a sidewall of the first gate electrode, and a second gate spacer on a sidewall of the second gate electrode, wherein the first and the second gate spacers are in a space between the first and the second gate electrodes, and wherein the first and the second gate spacers have a spacing of less than about 1000 Å.

4. The semiconductor structure of claim 1, wherein the common drain region and the first gate electrode have a first semiconductor substrate region therebetween, the common drain region and the second gate electrode have a second semiconductor substrate region therebetween, and wherein the first and the second semiconductor substrate regions comprise a same impurity as in the first and the second source extension regions, and wherein the impurity has a substantially lower concentration in the first and the second semiconductor substrate regions than in the first and the second source extension regions.

5. The semiconductor structure of claim 1, wherein the first gate electrode is electrically connected to the second gate electrode.

6. The semiconductor structure of claim 1, wherein the first asymmetric MOS transistor further comprises a first channel region between and adjoining the first source extension region and the common drain region, wherein the second asymmetric MOS transistor further comprises a second channel region between and adjoining the second source extension region and the common drain region, and wherein the first channel region and the second channel region are of an opposite conductivity type than a conductivity type of the first source extension region, the common drain region, and the second source extension region.

7. A semiconductor chip comprising:
a plurality of MOS transistors, wherein all MOS transistors in the semiconductor chip are asymmetric, and wherein the plurality of MOS transistors comprises at least one pair of MOS transistors comprising:
 a first asymmetric MOS transistor comprising a first gate electrode, and a first source and a first drain adjacent the first gate electrode; and
 a second asymmetric MOS transistor comprising a second gate electrode, and a second source and a second drain adjacent the second gate electrode, wherein the first gate electrode is connected to the second gate electrode, wherein the first and the second asymmetric MOS transistors share a common drain region comprising the first and the second drains, with the common drain region extending to substantially a same depth into a semiconductor substrate as the first and the second sources, and wherein the first and the second asymmetric MOS transistors are substantially free from drain extension regions.

8. The semiconductor chip of claim 7, wherein the first and the second gate electrodes have a distance between them of less than about two times a height of the first and the second gate electrodes.

* * * * *